United States Patent
Phanse et al.

(10) Patent No.: US 6,486,735 B1
(45) Date of Patent: Nov. 26, 2002

(54) ADAPTIVE EQUALIZER FILTER WITH VARIABLE GAIN CONTROL

(75) Inventors: Abhijit M. Phanse, Santa Clara; Michael X. Maida, San Jose, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/570,330

(22) Filed: May 12, 2000

(51) Int. Cl.[7] .................................................. H03F 3/45
(52) U.S. Cl. ........................ 330/254; 330/304; 330/257; 330/258
(58) Field of Search ................................ 330/254, 257, 330/258, 288, 303, 304

(56) References Cited

U.S. PATENT DOCUMENTS

| | | | |
|---|---|---|---|
| 5,038,114 A | * | 8/1991 | Blanken et al. .............. 330/288 |
| 5,892,402 A | * | 4/1999 | Tsubaki et al. .............. 330/288 |
| 6,359,511 B1 | | 3/2002 | Phanse et al. ............... 330/254 |
| 6,373,338 B1 | | 4/2002 | Phanse et al. ............... 330/257 |
| 6,407,637 B1 | | 6/2002 | Phanse et al. ............... 330/257 |

* cited by examiner

*Primary Examiner*—Steven J. Mottola
(74) *Attorney, Agent, or Firm*—John L. Maxin

(57) ABSTRACT

There is disclosed an adaptive equalizer filter with a current splitting system for variable gain control. The system comprises a current splitting circuit that splits an input current into a first current portion that is proportional to a first scale factor that has a value between zero and one. The remainder of the current is a second current portion that is proportional to a second scale factor that has a value that is equal to one minus the first scale factor. The current splitting circuit comprises a differential current mirror circuit that rejects common mode input current signals.

20 Claims, 7 Drawing Sheets

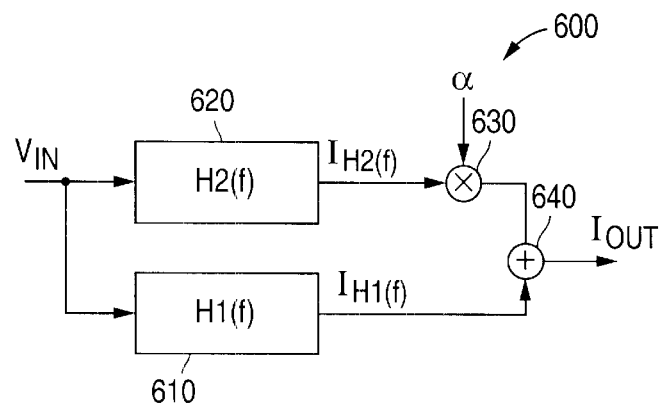
FIG. 6A
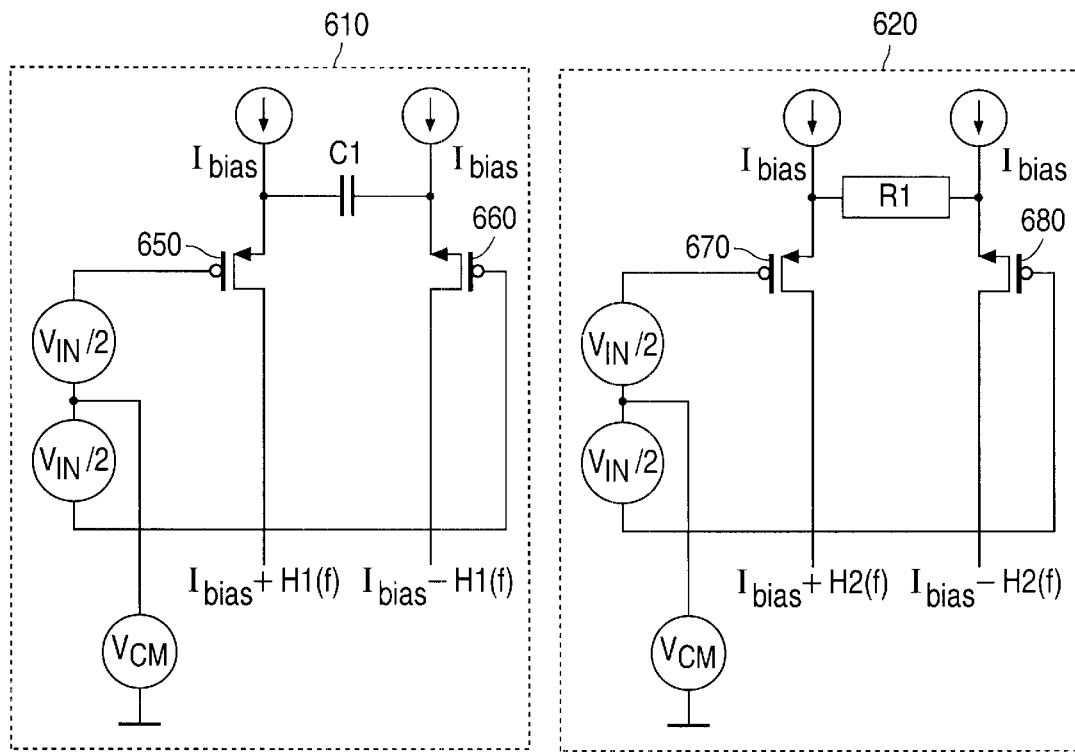
FIG. 6B  FIG. 6C

ADAPTIVE EQUALIZER FILTER WITH VARIABLE GAIN CONTROL

CROSS-REFERENCE TO RELATED APPLICATIONS

1. Ser. No. 09/570,082 filed May 12, 2000, entitled "SYSTEM AND METHOD FOR CURRENT SPLITTING FOR VARIABLE GAIN CONTROL," issued as U.S. Pat. No. 6,359,511 B1 on Mar. 19, 2002;
2. Ser. No. 09/569,958 filed May 12, 2000, entitled "DIFFERENTIAL CURRENT MIRROR SYSTEM AND METHOD;" now U.S. Pat. No. 6,373,338; and
3. Ser. No. 09/569,964 filed May 12, 2000, entitled "DIFFERENTIAL CURRENT MIRROR AND METHOD," now U.S. Pat. No. 6,407,637.

The above applications are commonly assigned to the assignee of the present invention. The disclosures of these related patent applications are hereby incorporated by reference for all purposes as if fully set forth herein.

TECHNICAL FIELD OF THE INVENTION

The present invention is generally directed to electronic control circuitry and, more specifically, to an adaptive equalizer filter that utilizes a differential current mirror system to achieve process-voltage-temperature compensated current splitting for variable gain control.

BACKGROUND OF THE INVENTION

Current mirrors are commonly used as electronic control circuits in integrated circuits. When a reference current is provided as an input to a current mirror, the current mirror provides an output current that is identical (or proportional) to the reference current. The term "current mirror" reflects the fact that the output current is a "mirror image" of the input reference current.

The difference between two current input signals is referred to as the differential mode of the two current input signals. The average value of two current input signals is referred to as the common mode of the two current input signals. In many applications input current signals may be represented as a linear combination of a differential mode component and a common mode component of the current input signals. It is often desirable to amplify the differential mode component by a large gain factor, while minimizing the amplification factor of the common mode component. Minimizing the amplification factor of the common mode component is referred to as "rejecting" the common mode component.

Prior art differential current mirrors are capable of providing two output currents that are identical (or proportional) to two input reference currents. However, prior art differential current mirrors are not capable of rejecting the common mode component of input current signals.

Variable gain control is desirable in many types of electronic control circuits. For example, in an adaptive equalization filter it is desirable to be able to vary the amount of gain within the filter to compensate for variations within the transmission channel. Additionally, it is desirable to be able to vary the amount of gain within the filter to compensate for changes within the circuit components caused by process-voltage-temperature (PVT) variations.

There is therefore a need in the art for an adaptive equalization filter comprising a differential current mirror system (1) that is capable of rejecting common mode input current signals and (2) that is capable of splitting an input current into two portions to provide signals for varying the amount of gain within a control circuit.

SUMMARY OF THE INVENTION

To address the above-discussed deficiencies of the prior art, it is a primary object of the present invention to provide an adaptive equalization filter comprising a differential current mirror system for providing differential output current signals (1) in which common mode current signals are rejected, and (2) in which an input current signal is split into two portions to provide signals for varying the amount of gain within a control circuit.

The differential current mirror of the present invention comprises a pair of diode connected transistors and a differential amplifier. In an advantageous embodiment of the present invention, the pair of diode connected transistors and the differential amplifier comprise MOSFET transistors. The pair of diode connected transistors comprises a first transistor and a second transistor coupled together. The differential amplifier comprises a third transistor and a fourth transistor in which the gate of the third transistor receives a first input current signal from the drain of the first transistor and in which the gate of the fourth transistor receives a second input current signal from the drain of the second transistor.

It is an object of the present invention to provide a differential current mirror that provides common mode rejection of current signals.

It is another object of the present invention to provide a common mode rejection differential current mirror that provides power supply rejection at the output.

It is still another object of the present invention to provide a common mode rejection differential current mirror with a mirroring ratio that is independent of process-voltage-temperature (PVT) variations in the electronic components of the system.

It is yet another object of the present invention to provide a common mode rejection differential current mirror that can operate at low voltages.

The current splitting circuit of the present invention comprises a differential current splitting circuit that splits an input current into a first current portion that is proportional to a first scale factor that has a value between zero and one. The remainder of the current is a second current portion that is proportional to a second scale factor that has a value that is equal to one minus the first scale factor.

It is an object of the present invention to provide a current splitting circuit that is capable of splitting an input current into two portions to provide signals for varying the amount of gain within a control circuit.

It is also an object of the present invention to provide a current splitting circuit that is capable of providing signals for varying the amount of gain within a control circuit in a manner that is very accurate and independent of process-voltage-temperature (PVT) variations in the electronic components of the system.

It is also an object of the present invention to provide a current splitting circuit that can operate at low voltages.

It is also an object of the present invention to provide a current splitting circuit that is capable of providing variable gain control signals in an adaptive equalization filter.

It is also an object of the present invention to provide an adaptive equalization filter that comprises the current splitting circuit of the present invention.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIG. 6A illustrates a block diagram of an exemplary adaptive equalization filter;

FIG. 6B illustrates a first filter component of the exemplary adaptive equalization filter;

FIG. 6C illustrates a second filter component of the exemplary adaptive equalization filter;

DETAILED DESCRIPTION OR THE INVENTION

FIGS. 1 through 9, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged differential current mirror and current splitting circuit.

Figure 1:
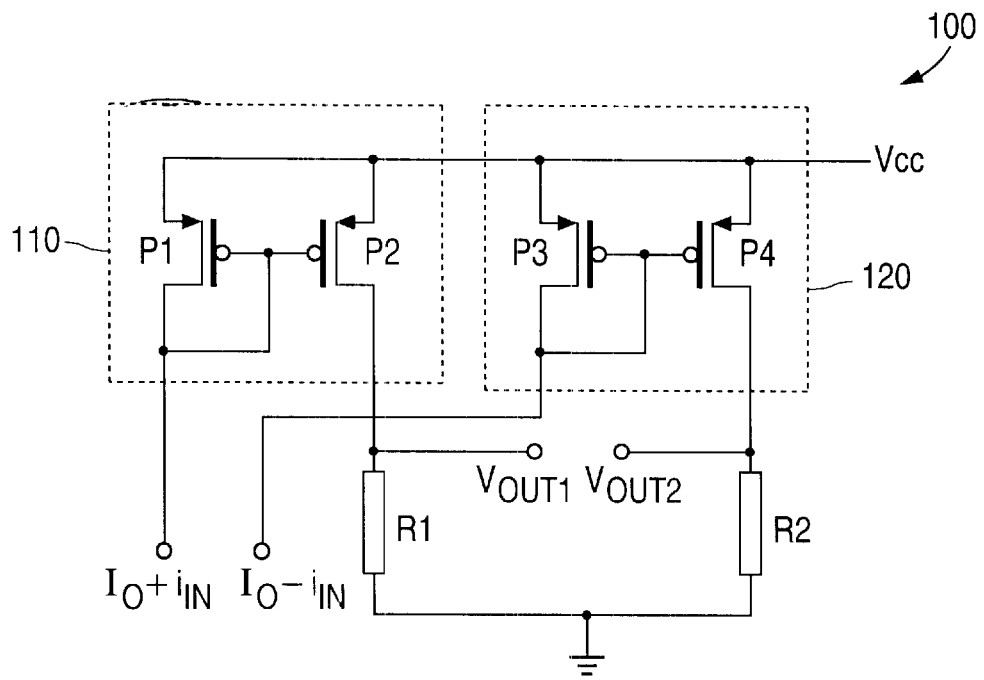
FIG. 1 illustrates a prior art differential current mirror.

FIG. 1 illustrates a prior art differential current mirror 100. Differential current mirror 100 comprises first current mirror 110 and second current mirror 120. First current mirror 110 comprises two metal oxide semiconductor field effect transistors, P1 and P2, coupled together in a current mirror configuration. Similarly, second current mirror 120 comprises two metal oxide semiconductor field effect transistors, P3 and P4, coupled together in a current mirror configuration.

Current $I_O+i_{IN}$ is input to transistor P1 of current mirror 110 and current $I_O-i_{IN}$ is input to transistor P3 of current mirror 120. The current $I_O$ represents a DC bias current and $i_{IN}$ represents an AC signal current. The differential output voltage is measured between the terminals $V_{OUT1}$ and $V_{OUT2}$.

The difference between two current input signals, $i_1$ and $i_2$, is called the differential mode of the two current input signals and is defined as:

$$I_{dm}=i_1-i_2 \qquad (1)$$

The average value of two current input signals, $i_1$ and $i_2$, is called the common mode of the two current input signals and is defined as:

$$I_{cm}=\tfrac{1}{2}(i_1+i_2) \qquad (2)$$

Input signals that are neither purely differential mode input signals nor purely common mode input signals can be expressed as linear combinations of the differential mode signal components and the common mode signal components. When input signals are provided to the two inputs of a differential amplifier (not shown in FIG. 1), the differential amplifier will respond to the differential mode component with a differential mode gain and will respond to the common mode component with a common mode gain. This superposition is valid when the differential amplifier's response is linear.

It is often desirable to amplify the differential mode component of two input signals by a large gain factor while minimizing the amplification factor of the common mode component. Minimization of the amplification factor of the common mode component is referred to as "rejecting" the common mode of the input signals. A measurement of the amount of rejection of the common mode is a figure of merit called the common mode rejection ratio (CMRR). The CMRR is defined as the ratio of the magnitude of the differential mode gain to the magnitude of the common mode gain. The definition is:

$$CMRR = \frac{|\text{differential mode gain}|}{|\text{common mode gain}|} \quad (3)$$

The CMRR is often measured in decibels, so that an alternate definition is:

$$CMRR = 20\log_{10}\frac{|\text{differential mode gain}|}{|\text{common mode gain}|} \quad (4)$$

If the width (W) and the length (L) of the gates in transistor P1 and transistor P2 in current mirror 110 are equal to the width (W) and the length (L) of the gates in transistor P3 and transistor P4 in current mirror 120, then current mirror 110 and current mirror 120 each have a current gain equal to one.

A current gain of one for current mirror 110 and current mirror 120 means that (1) the differential mode of the two input current signals, $I_O+i_{IN}$ and $I_O-i_{IN}$, also has a gain equal to one, and (2) the common mode of the two input current signals, $I_O+I_{IN}$ and $I_O-i_{IN}$, also has a gain equal to one.

Because the common mode signals have a gain equal to one (i.e., there is no reduction in the amplitude of the signal), there is no rejection of the common mode signals. Because the differential mode signals also have a gain equal to one, the differential mode gain is equal to the common mode gain. This means that the value of CMRR is also equal to one. In decibels, the value of CMRR is zero (0) decibels because $\log_{10}$ (1) is zero.

It is possible to achieve current gains other than one by varying the ratio of width to length (W/L) of transistor P2 to transistor P1 (and of transistor P3 to transistor P4). But the current gains achieved in this way are again the same for both the differential mode signals and the common mode signals. Prior art differential current mirrors of this type are not able to provide rejection of the common mode components of two input signals.

In order to overcome these deficiencies in the prior art, the present invention provides a differential current mirror than can replicate (or "mirror") the differential mode components of two input signals while rejecting the common mode components of the two input signals. As will be more fully explained, the present invention utilizes the differential transconductance of a differential amplifier pair to achieve this result.

Figure 2:
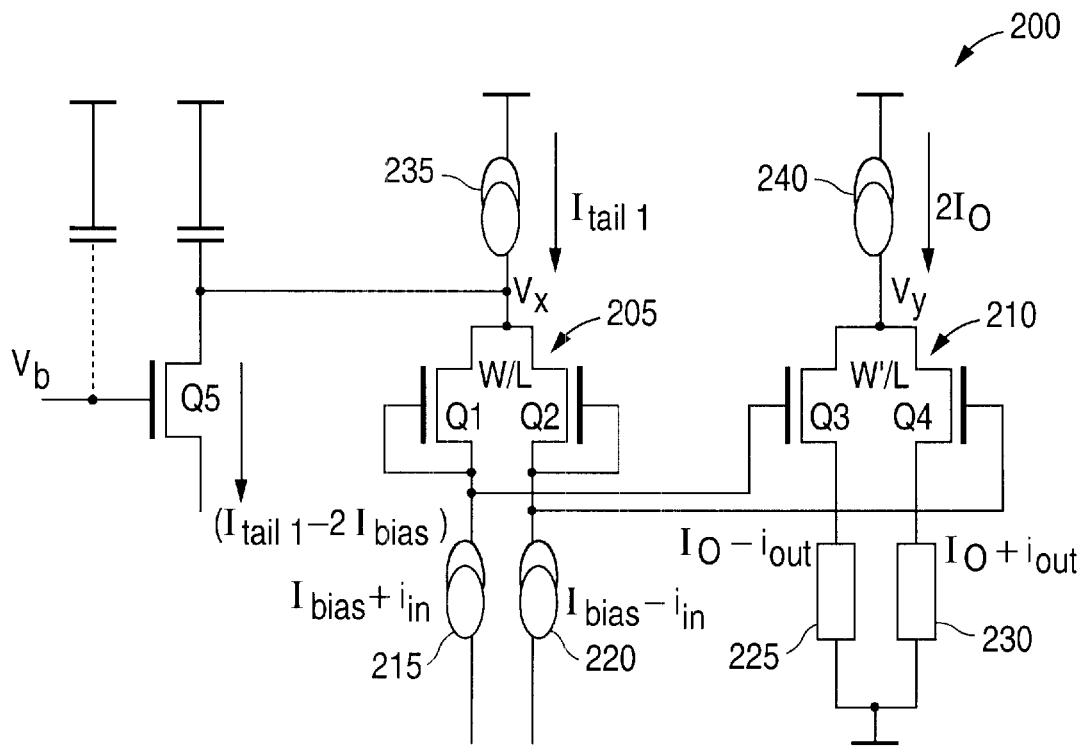
FIG. 2 illustrates an exemplary differential current mirror according to one embodiment of the present invention.

FIG. 2 illustrates exemplary differential current mirror 200 according to one embodiment of the present invention. Differential current mirror 200 comprises a pair of diode connected transistors 205 coupled to a differential amplifier 210. The pair of diode connected transistors 205 comprises two metal oxide semiconductor field effect transistors (MOSFETs), Q1 and Q2. The width (W) to length (L) ratio of the gates in transistors Q1 and Q2 is indicated by the expression (W/L).

Similarly, differential amplifier 210 comprises two MOSFETs, Q3 and Q4, coupled together in a differential amplifier configuration. The width (W') to length (L) ratio of the gates in transistors Q3 and Q4 is indicated by the expression (W/L). It is seen that the length (L) of the gates in the pair of diode connected transistors 205 and the length (L) of the gates in differential amplifier 210 are the same. However, the width (W) of the gates in the pair of diode connected transistors 205 is not equal to the width (W') of the gates in differential amplifier 210.

The bias current $I_D$ through a MOSFET in the constant current region is given by:

$$I_D = K(V_{GS}-V_{TR})^2 \quad (5)$$

where K equals the conductance parameter of the transistor, $V_{GS}$ is the gate to source voltage, and $V_{TR}$ is the threshold voltage of the transistor. The conductance parameter K of a MOSFET transistor may be expressed in the form:

$$K = \tfrac{1}{2}\,\mu C_{OX}(W/L) \quad (6)$$

where $\mu$ is a material dependent parameter called the carrier mobility, where $C_{OX}$ is the gate to substrate capacitance per unit area (measured in picofarads per square micrometer), where W is the width of the gate (measured in micrometers), and where L is the length of the gate (measured in micrometers). The conductance parameter K is measured in milliamps per volts squared.

The transconductance parameter $g_m$ is defined to be the partial derivative of the drain current (i.e., the bias current plus the signal current) with respect to the gate to source voltage. The partial derivative is evaluated at the bias point where the bias current is ID and the gate to source voltage is $V_{GS}$.

If the transistor is biased in the constant current region, then the transconductance parameter $g_m$ may be expressed in the form:

$$g_m = 2[K\,I_D]^{1/2} \quad (7)$$

The transconductance parameter $g_m$ is a conductance that is measured in units of siemens (or, equivalently, mhos) Using the expression for K from equation (6) the transconductance parameter $g_m$ may be expressed in the form:

$$g_m = [2I_D \mu C_{OX}(W/L)]^{1/2} \quad (8)$$

In FIG. 2, current source 215 provides a current that is equal to $I_{bias}+i_{IN}$. Current source 215 is coupled to the drain and to the gate of transistor Q1 in the pair of diode connected transistors 205. Current source 215 is also coupled to the gate of transistor Q3 in differential amplifier 210. Current source 220 provides a current that is equal to $I_{bias}-i_{IN}$. Current source 220 is coupled to the drain and to the gate of transistor Q2 in the pair of diode connected transistors 205. Current source 220 is also coupled to the gate of transistor Q4 in differential amplifier 210.

Load 225 is coupled to the drain of transistor Q3 in differential amplifier 210. The current that flows through load 225 is equal to $I_O-i_{OUT}$. Load 230 is coupled to the drain of transistor Q4 in differential amplifier 210. The current that flows through load 230 is equal to $I_O+i_{OUT}$.

"Current source 235 is coupled to the source of transistor Q1 and to the source of transistor Q2 in the pair of diode connected transistors 205. Current source 235 provides a current that is equal to $I_{tail\ 1}$. The source of transistor Q5 (with a gate voltage of $V_b$) is also coupled to the source of transistor Q1 and to the source of transistor Q2 in the pair of diode connected transistors 205. Because the current through transistor Q5 is equal to $I_{tail\ 1}-2I_{bias}$, the amount of current that enters the pair of diode connected transistors 205 is equal to $2I_{bias}$. Because transistor Q1 and transistor Q2 are matched, it follows from symmetry that the current $2I_{bias}$ will divide equally between transistor Q1 and transistor Q2 and provide each with a bias current equal to $I_{bias}$."

Current source 240 is coupled to the source of transistor Q3 and to the source of transistor Q4 in differential amplifier 210. Current source 240 provides a current that is equal to $2I_O$.

In the pair of diode connected transistors 205, the transconductance parameter of transistor Q1 ($g_m(1)$) and the transconductance parameter of transistor Q2 ($g_m(2)$) are both given by the same expression:

$$g_m(1)=g_m(2)=[2I_{bias}\mu C_{OX}(W/L)]^{1/2} \qquad (9)$$

$I_{bias}$ is the bias current for transistor Q1. $I_{bias}$ is also the bias current for transistor Q2. The differential mode transconductance parameter $g_m(1,2)$ for the pair of diode connected transistors 205 equals the transconductance parameter for transistor Q1 and for transistor Q2.

$$g_m(1,2)=g_m(1)=g_m(2) \qquad (10)$$

In differential amplifier 210, the transconductance parameter of transistor Q3 ($g_m(3)$) and the transconductance parameter of transistor Q4 ($g_m(4)$) are both given by the same expression:

$$g_m(3)=g_m(4)=[2I_O\mu C_{OX}(W'/L)]^{1/2} \qquad (11)$$

$I_O$ is the bias current for transistor Q3. $I_O$ is also the bias current for transistor Q4. Note that in the case of transistor Q3 and transistor Q4, the width W' is used instead of the width W. The differential mode transconductance parameter $g_m(3,4)$ for differential amplifier 210 equals the transconductance parameter for transistor Q3 and for transistor Q4.

$$g_m(3,4)=g_m(3)=g_m(4) \qquad (12)$$

The relationship between the input signal current $i_{IN}$ and the output signal current $i_{OUT}$ is given by:

$$i_{OUT}=i_{IN}[g_m(3,4)/g_m(1,2)] \qquad (13)$$

Utilizing equations (9), (10), (11) and (12), the result of equation (13) may also be expressed as:

$$i_{OUT}=i_{IN}[SQRT\{I_OW'\}/SQRT\{I_{bias}W\}] \qquad (14)$$

The output currents of differential amplifier 210 are $I_O-i_{OUT}$ and $I_O+i_{OUT}$. The output currents provide a differential mirroring of the input currents while rejecting the common mode signal.

The voltage at the point identified $V_X$ in the pair of diode connected transistors 205 may be obtained from the expression:

$$V_X=V_b+V_{t5}+SQRT\{A/B\} \qquad (15)$$

where $A=2(I_{tail1}-2I_{bias})$ and $B=\mu C_{OX}(W/L)_5$. The term $V_b$ is the bias voltage of transistor Q5. The term $V_{t5}$ is the threshold voltage of transistor Q5. The term $(W/L)_5$ is the width to length ratio of the gate of transistor Q5.

The voltage at the point identified $V_Y$ in differential amplifier 210 may be obtained from the expression:

$$V_Y=V_b+V_{t5}+SQRT\{X\}-SQRT\{Y\}+SQRT\{Z\} \qquad (16)$$

where:

$X=[2(I_{tail1}-2I_{bias})/(\mu C_{OX}(W/L)_5)]$, $Y=[(2I_{bias})/(\mu C_{OX}(W/L))]$, and $Z=[(2I_O)/(\mu C_{OX}(W'/L))]$.

The term (W/L) is the width to length ratio of each of the gates of transistor Q1 and transistor Q2. The term (W'/L) is the width to length ratio of each of the gates of transistor Q3 and transistor Q4.

The transconductance parameter $g_m(3,4)$ is the differential mode transconductance of differential amplifier 210. One can also define its common mode transconductance as the partial derivative of the common mode output current (Id3+Id4)/2 with respect to the common mode input voltage (Vg3+Vg4)/2. The common mode transconductance of differential amplifier 210 is equal to its differential mode transconductance divided by the factor:

$$[(r_O/2)+(1/g_m(3))]g_m(3) \qquad (17)$$

where $r_O$ is the output resistance of current source 240. Since the common mode rejection ratio (CMRR) of differential amplifier 210 is equal to its common mode transconductance divided by its differential mode transconductance, the same factor is equal to the CMRR. The reason that CMRR is normally very high for a differential pair is that the output resistance of a device configured as a current source is usually much greater than a transistor's transconductance, making this factor much greater than unity. In CMOS this CMRR may range from 30 dB to 60 dB, largely dependent on the configuration of the current source, such as single transistor or cascode.

The analysis set forth above relates to the direct current case. At higher frequencies the capacitances at the source of transistor Q3 and transistor Q4 will cause the value of the common mode rejection ratio (CMRR) to be degraded. Capacitance admittance is equal to two pi ($2\pi$) times the frequency times the capacitance. As long as the capacitance admittance is much less than $g_m(3)$, then the CMRR will still be much greater than unity.

Figure 3:
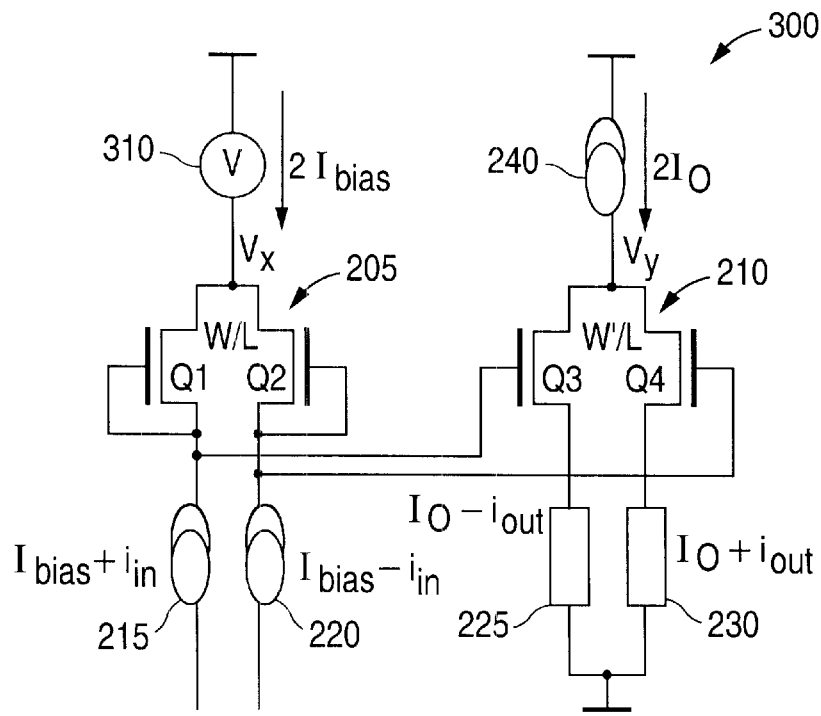
FIG. 3 illustrates an exemplary differential current mirror according to an alternate embodiment of the present invention.

FIG. 3 illustrates an exemplary differential current mirror 300 according to an alternate embodiment of the present invention. In differential current mirror 300 a voltage source 310 is coupled to the pair of diode connected transistors 205. Voltage source 310 provides a current equal to $2I_{bias}$. The operation of differential current mirror 300 is the same as that previously described for differential current mirror 200.

Figure 4:
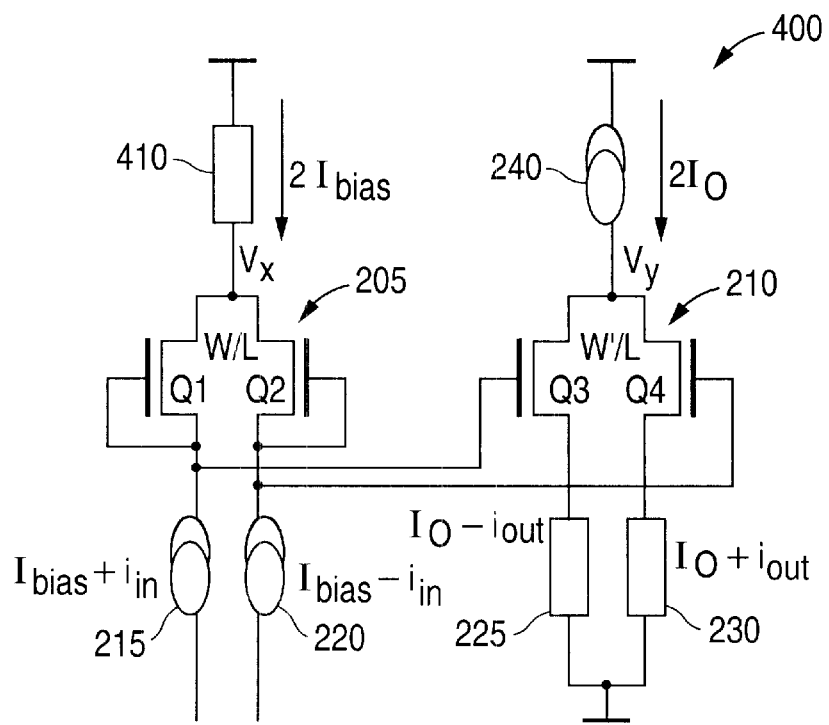
FIG. 4 illustrates an exemplary differential current mirror according to another alternate embodiment of the present invention.

FIG. 4 illustrates an exemplary differential current mirror 400 according to another alternate embodiment of the present invention. In differential current mirror 400 load 410 is coupled to the pair of diode connected transistors 205. The most common form of load 410 is a resistor. The operation of differential current mirror 400 is the same as that previously described for differential current mirror 200.

Figure 5:
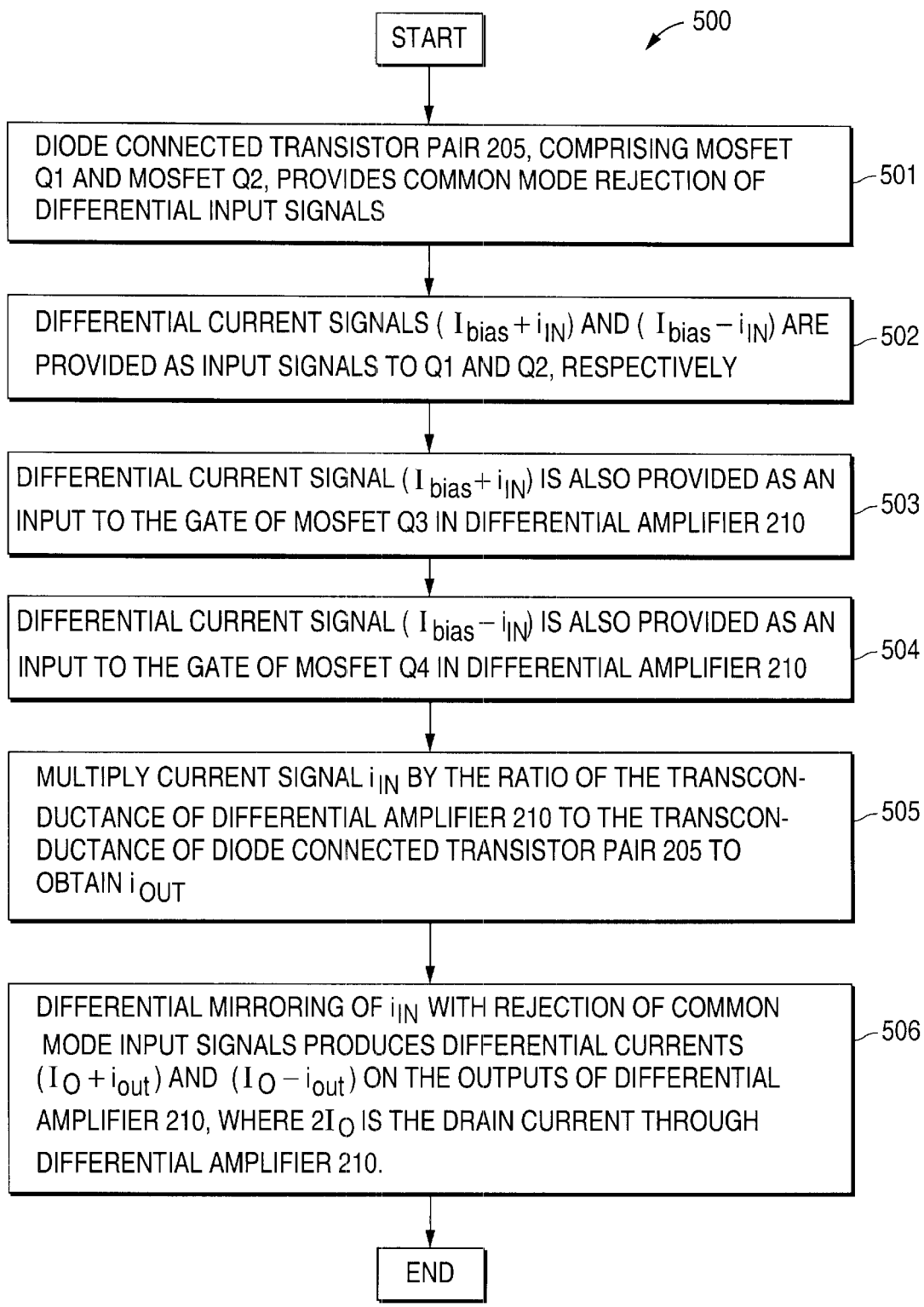
FIG. 5 is a flow diagram describing the logic of the operation of one embodiment of an exemplary differential current mirror of the present invention.

FIG. 5 is a flow diagram describing the logic of the operation of one embodiment of the differential current mirror of the present invention. In operation step 501 MOSFET transistor Q1 and MOSFET transistor Q2 are coupled together as a pair of diode connected transistors 205 in a common mode rejection configuration. In operation step 502 a differential current signal $I_{bias}+i_{IN}$ is provided to transistor Q1 and a differential current signal $I_{bias}-i_{IN}$ is provided to transistor Q2. In operation step 503 the differential current signal $I_{bias}+i_{IN}$ is provided to the gate of MOSFET transistor Q3 of differential amplifier 210. In operation step 504 the differential current signal $I_{bias}-i_{IN}$ is provided to the gate of MOSFET transistor Q3 of differential amplifier 210.

In operation step 505 the current signal $i_{OUT}$ is calculated by multiplying the current signal $i_{IN}$ by the ratio of the transconductance of differential amplifier 210 to the transconductance of the pair of diode connected transistors 205. In operation step 506 the differential output currents $I_O+i_{OUT}$ and $I_O-i_{OUT}$ are obtained from the outputs of differential amplifier 210. These differential output currents represent a differential mirroring of the input currents with rejection of the common mode signal.

The differential current mirror of the present invention provides several advantages over the prior art. The differential current mirror of the present invention provides good common mode rejection of current signals. In addition, the differential current mirror of the present invention provides good power supply rejection at the output. The mirroring ratio is independent of process-voltage-temperature (PVT) variations. Lastly, the differential current mirror of the present invention provides a good low voltage solution to task of mirroring differential current signals with common mode rejection of current signals.

The differential current mirror system of the present invention may be used in a current splitting circuit to achieve current splitting for variable gain control. For purposes of illustration the current splitting circuit of the present invention will be described in connection with an adaptive equalization filter. The current splitting circuit will be used in the adaptive equalization filter to compensate for variations in the transmission channel independent of process-voltage-temperature variations in the filter components. It is to be borne in mind that the current splitting circuit may be used to provide variable gain control in any type of control circuit and is not limited to use in an adaptive equalization filter.

FIG. 6A illustrates a block diagram of exemplary adaptive equalization filter 600. Adaptive equalization filter 600 is represented by two filter circuits, 610 and 620, coupled in parallel. Filter circuit 610 has a transfer function of H1(f) Filter circuit 620 has a transfer function of H2(f). Both H1(f) and H2(f) are transimpedance circuits in which the input is a voltage signal and the output is a current signal. An input voltage signal $V_{IN}$ is input to both filter circuit 610 and filter circuit 620. The output current signal of H1(f) is denominated $I_{H1(f)}$ and the output current signal of H2(f) is denominated $I_{H2(f)}$.

The output current of filter circuit 620, $I_{H2}(f)$, is multiplied by a coefficient denominated as alpha ($\alpha$) in multiplier unit 630. As will be more fully explained, the value of alpha is a variable coefficient having a range of values between zero (0) and one (1). The variability of alpha provides variable gain control for the output current of filter circuit 610.

The output current of filter circuit 610, $I_{H1(f)}$ is not multiplied by a coefficient. The output current of filter circuit 620, $I_{H2(f)}$, that is multiplied by alpha and the output current of filter circuit 610, $I_{H1(f)}$, are added in adder 640 to provide total output current $I_{OUT}$. The interconnection of the block diagrams of filter circuit 610, filter circuit 620, multiplier unit 630, and adder 640 as shown in FIG. 6 illustrate the logic of the operation of adaptive equalization filter 600. The relationship between the input voltage $V_{IN}$ and the output current $I_{OUT}$ may be expressed as follows:

$$I_{OUT}=V_{IN}[H1(f)+\alpha(H2(f))] \quad (18)$$

Alternatively, $$I_{OUT}=I_{H1(f)}+\alpha(I_{H2(f)}) \quad (19)$$

FIG. 6B illustrates a circuit for filter circuit 610. Filter circuit 610 provides a high pass response for differential input/output. MOSFET transistor 650 and MOSFET transistor 660 each receive a bias current equal to $I_{bias}$. Transistor 650 and transistor 660 are coupled through capacitor C1. Higher order RC networks may be used in place of a single capacitor for specific equalizer responses. The gate of transistor 650 and the gate of transistor 660 are each coupled to a voltage signal that is equal to one half of $V_{IN}$. The output signals of filter circuit 610 are $I_{bias}$+H1(f) and $I_{bias}$−H1(f).

FIG. 6C similarly illustrates a circuit for filter circuit 620. Filter circuit 620 provides an all pass response for differential input/output. MOSFET transistor 670 and MOSFET transistor 680 each receive a bias current equal to $I_{bias}$. Transistor 670 and transistor 680 are coupled through resistor R1. The gate of transistor 670 and the gate of transistor 680 are each coupled to a voltage signal that is equal to one half of $V_{IN}$. The output signals of filter circuit 620 are $I_{bias}$+H2(f) and $I_{bias}$−H2(f).

Figure 7A:
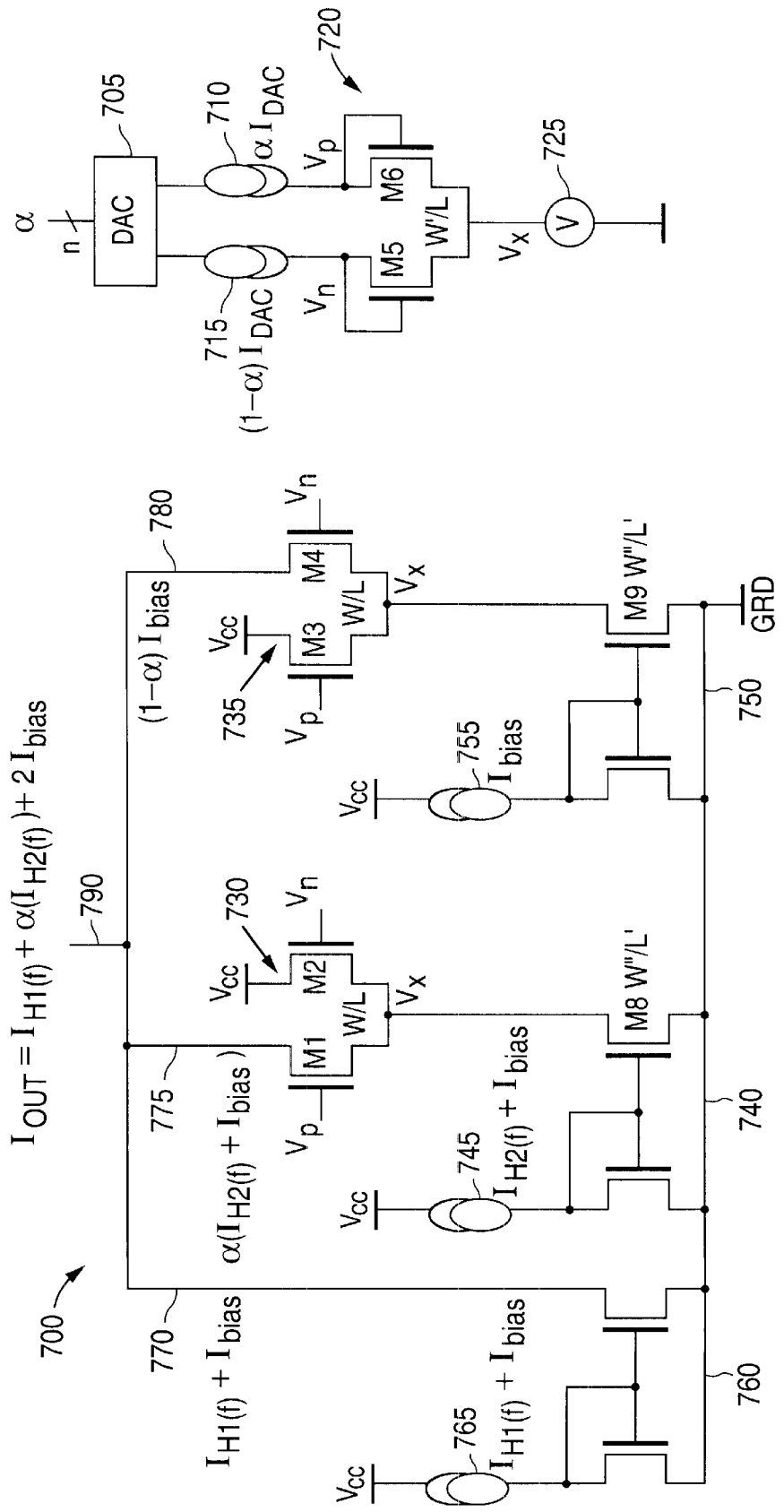
FIG. 7A illustrates a first portion of an exemplary differential current splitting circuit according to one embodiment of the present invention.
Figure 7B:
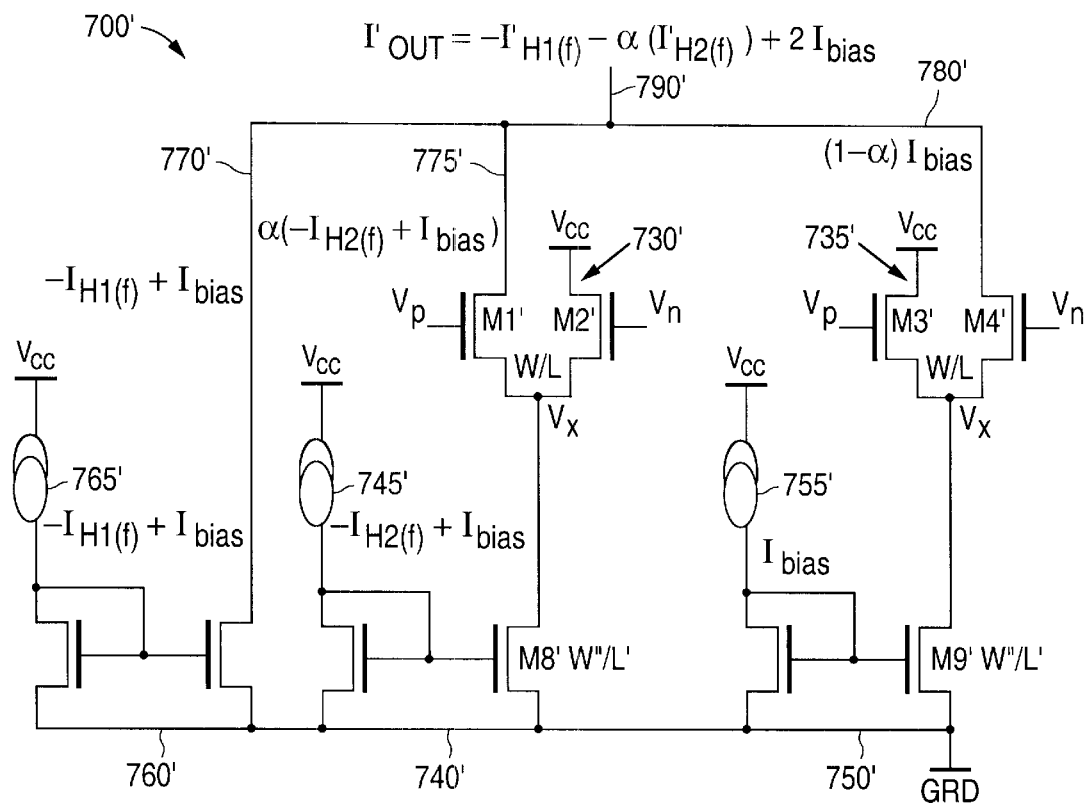
FIG. 7B illustrates a second portion of an exemplary current splitting circuit according to one embodiment of the present invention.

FIG. 7A and FIG. 7B illustrate an exemplary differential current splitting circuit 700 according to one embodiment of the present invention. Current splitting circuit 700 implements the logic of operation of adaptive equalization filter 600. As shown in FIG. 7A, digital to analog converter (DAC) 705 receives an input value of alpha ($\alpha$) in a computer word of n binary bits. DAC 705 reads the value of alpha from the n binary bits and produces two output current signals. The first output current signal is equal to a DAC output current times alpha, i.e., $\alpha\,I_{DAC}$. The second output current signal is equal to the DAC output current times the quantity one minus alpha, i.e., $(1-\alpha)\,I_{DAC}$. Because the value of alpha varies between zero (0) and one (1), the values of the two output current signals, $\alpha\,I_{DAC}$ and $(1-\alpha)\,I_{DAC}$, are complementary and their sum is one (1). $\alpha\,I_{DAC}$, the first output current signal, is represented by current source 710 and $(1-\alpha)\,I_{DAC}$, the second output current signal, is represented by current source 715.

These first and second output current signals from DAC 705 serve as input current signals that flow into two MOSFET transistors, M5 and M6, in the pair of diode connected transistors 720. The gate of transistor MS and the gate of transistor M6 each have a width to length ratio of (W'/L). The source of transistor M5 and the source of transistor M6 are each connected to bias voltage source 725 having a bias voltage of V. In this embodiment the voltage $V_X$ at the sources of transistor M5 and transistor M6 has the value of the bias voltage V.

In an alternate embodiment of the present invention, the voltage $V_X$ at the sources of transistor M5 and transistor M6 may be supplied by replacing bias voltage source 725 with a load such as a resistor (not shown). The load is chosen so that the value of the voltage drop across the load provides the desired voltage $V_X$ at the sources of transistor M5 and transistor M6.

The input current signal $(1-\alpha)\,I_{DAC}$ that flows into transistor M5 develops control voltage $V_n$ as a $V_{GS}$ (gate to source voltage) above the source voltage $V_X$. Similarly, the input current signal $\alpha\,I_{DAC}$ that flows into transistor M6 develops control voltage $V_P$ as a $V_{GS}$ (gate to source voltage) above the source voltage $V_X$.

Current splitting circuit 700 also comprises differential amplifier 730 and differential amplifier 735 coupled in parallel. Differential amplifier 730 comprises two MOSFET transistors, M1 and M2. Differential amplifier 735 comprises two MOSFET transistors, M3 and M4. The gates of transistors M1, M2, M3 and M4 each have a width to length ratio of (W/L).

Current mirror 740 receives a reference current equal to $I_{H2(f)}+I_{bias}$ from current source 745 and provides a replica of this reference current to differential amplifier 730. MOSFET transistor M8 of current mirror 740 has a width to length ratio of (W"/L'). Current mirror 750 receives a reference current equal to $I_{bias}$ from current source 755 and provides a replica of this reference current to differential amplifier 735. MOSFET transistor M9 of current mirror 750 also has a width to length ratio of (W"/L'). Current mirror 760 receives a reference current equal to $I_{H1(f)}+I_{bias}$ from current source 765 and provides a replica of this reference current to signal line 770.

Control voltage $V_n$ from transistor M5 is connected to the gate of transistor M4. Control voltage $V_p$ from transistor M6 is connected to the gate of transistor M3. This causes the pair of diode connected transistors 720 and differential amplifier 735 to form a differential current mirror that rejects common mode signals in the manner previously described.

Similarly, control voltage $V_n$ from transistor M5 is connected to the gate of transistor M2. Control voltage $V_p$ from transistor M6 is connected to the gate of transistor M1. This causes the pair of diode connected transistors 720 and differential amplifier 730 to form a differential current mirror that rejects common mode signals in the manner previously described.

The current $I_{DAC}$ is selected to be equal to $I_{bias}$ multiplied by the width to length ratio of the gates of the pair of diode connected transistors 720 divided by the width to length ratio of the gates of differential amplifier 730 (or differential amplifier 735). The selected current $I_{DAC}$ may be expressed as:

$$I_{DAC}=I_{bias}[(W'/L)/(W/L)] \qquad (20)$$

When $I_{DAC}$ is set to this value, then differential amplifier 730 and differential amplifier 735 each partition the current in proportion to α and (1−α). The source voltage of transistors M1 and M2 and the source voltage of transistors M3 and M4 follow the source voltage of transistors M5 and M6 and become equal to $V_X$. The value of voltage $V_X$ is chosen to make transistor M8 of current mirror 740 and transistor M9 of current mirror 750 remain in saturation (i.e., remain healthy current sources).

The drain of transistor M1 is coupled to signal line 775 and the drain of transistor M4 is coupled to signal line 780. The current in signal line 775 is equal to $[\alpha\,(I_{H2(f)}+I_{bias})]$ and the current in signal line 780 is equal to $[(1-\alpha)I_{bias}]$. The current in signal line 770 is equal to $[I_{H1(f)}+I_{bias}]$. Signal line 770, signal line 775 and signal line 780 are combined into signal line 790. The combined current in signal line 790 is:

$$I_{H1(f)}+\alpha(I_{H2(f)})+2I_{bias} \qquad (21)$$

Except for the bias current term, $2I_{bias}$, this is the same expression as that in Equation (19). Subtracting the bias current term from Equation (21) provides a value for $I_{OUT}$, the desired output signal. The value of the term $\alpha\,I_{H2(f)}$ will vary from zero to $I_{H2(f)}$ as the value of α varies from zero to one. The output on signal line 790 is one half of a differential output.

FIG. 7B illustrates a circuit for obtaining current signals that are opposite in sign to the current signals obtained in the circuit shown in FIG. 7A. The control voltages $V_n$ and $V_P$ are generated as previously described. The circuit components shown in FIG. 7B are given the same identifying numbers but with primes added. Negative current signals are indicated with a preceding minus sign. As in the case of FIG. 7A, the output on signal line 790' is also one half of a differential output. The complete differential current splitting circuit 700 comprises both the positive current circuit shown in FIG. 7A and the negative current circuit shown in FIG. 7B.

The current splitting circuit 700 provides a linear control of gain with respect to the computer word of n binary bits that sets the value of alpha. This is achieved by performing a current-voltage (I-V) square law conversion using the transistors M5 and M6 in the pair of diode connected transistors 720, and then performing a voltage-current (V-I) square law conversion using the transistors M1 and M2 in differential amplifier 730 (and using the transistors M3 and M4 in differential amplifier 735. This method of providing linear control of gain is independent of process-voltage-temperature (PVT) changes because changes in the PVT conditions are tracked by the gain stage and the replica bias.

Figure 8:
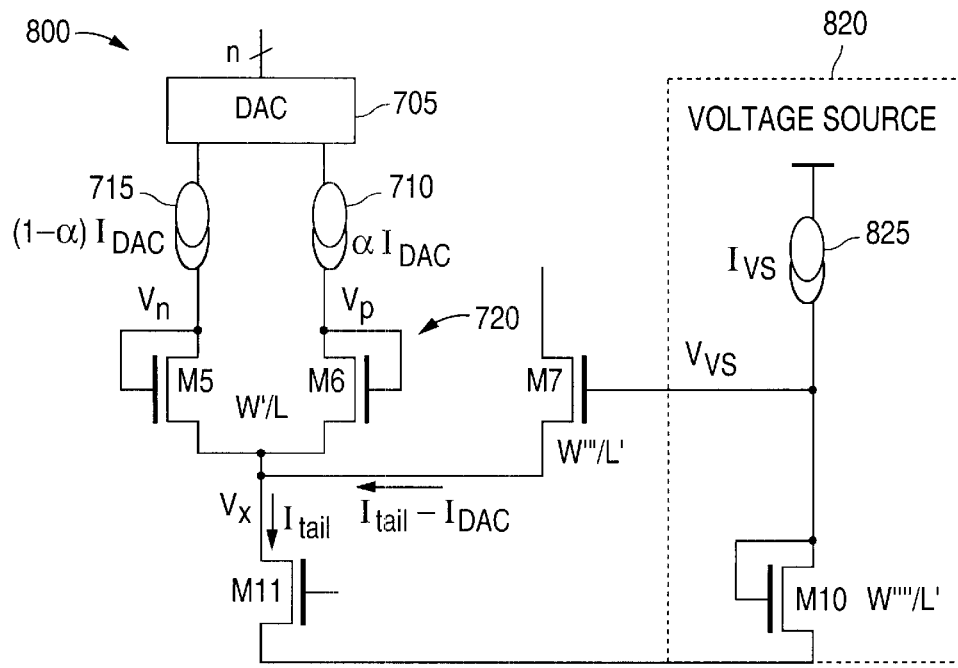
FIG. 8 illustrates an alternate exemplary current splitting circuit according to one embodiment of the present invention.

FIG. 8 illustrates a portion of an exemplary current splitting circuit 700 according to an alternate embodiment of the present invention. As previously described, digital to analog converter (DAC) 705 receives a computer word of n binary bits that sets the value of alpha (α). DAC 705 produces two output current signals. The first output current signal is equal to the product of the DAC output current signal Idac times alpha, i.e., $\alpha I_{DAC}$. The second output current signal is equal to the product of the DAC output current signal times the quantity one minus alpha, i.e., $(1-\alpha)I_{DAC}$.

The first and second output current signals from DAC 705 serve as input current signals for transistor MS and transistor M6 in the pair of diode connected transistors 720. In this embodiment of the present invention, the voltage $V_X$ at the sources of transistor M5 and transistor M6 is generated by MOS field effect transistor M7 that is coupled to voltage source 820.

Voltage source 820 comprises current source 825 that is coupled to MOS field effect transistor M10. The gate of transistor M10 has a width to length ratio of (W''''/L'). Transistor M10 develops control voltage $V_{VS}$ as a $V_{GS}$ (gate to source voltage) as a result of the flow of input current signal $I_{VS}$ from current source 825. The $V_{VS}$ from transistor M10 is supplied to the gate of MOS field effect transistor M7 which is biased by MOS field effect transistor M11 and other circuits (not shown) to produce output voltage $V_X$ and to cause the current through transistor M7 to be equal to $I_{tail}-I_{DAC}$. The gate of transistor M7 has a width to length ratio of (W''''/L'). The sum of the currents from transistor M5, transistor M6, and transistor M7 results in a current of $I_{tail}$ through transistor M11. Voltage $V_X$ serves as the bias voltage for transistor M5 and transistor M6.

In order to keep transistor M8 and transistor M9 in saturation, voltage $V_X$ must be greater or equal to $V_{dsat}(8,9)$ where $V_X$ and $V_{dsat}(8,9)$ have the values set forth below.

$$V_X \geq V_{dsat}(8,9) \qquad (22)$$

$$V_X=SQRT\{2/\mu C_{OX}\}[SQRT\{X\}-SQRT\{Y\}] \geq V_{dsat}(8,9) \qquad (23)$$

where:

$X=I_{VS}/(W''''/L')$ $Y=[(I_{tail1}-I_{dac})/(W'''/L')]$.

$$V_{dsat}(8,9)=SQRT\{Z\} \text{ or } 2I_{bias}/g_m(8,9) \qquad (24)$$

where $Z=(2I_{bias})/(\mu C_{OX}(W''/L'))$ and where $g_m(8,9)$ is the differential transconductance of transistor M8 and transistor M9.

Figure 9:
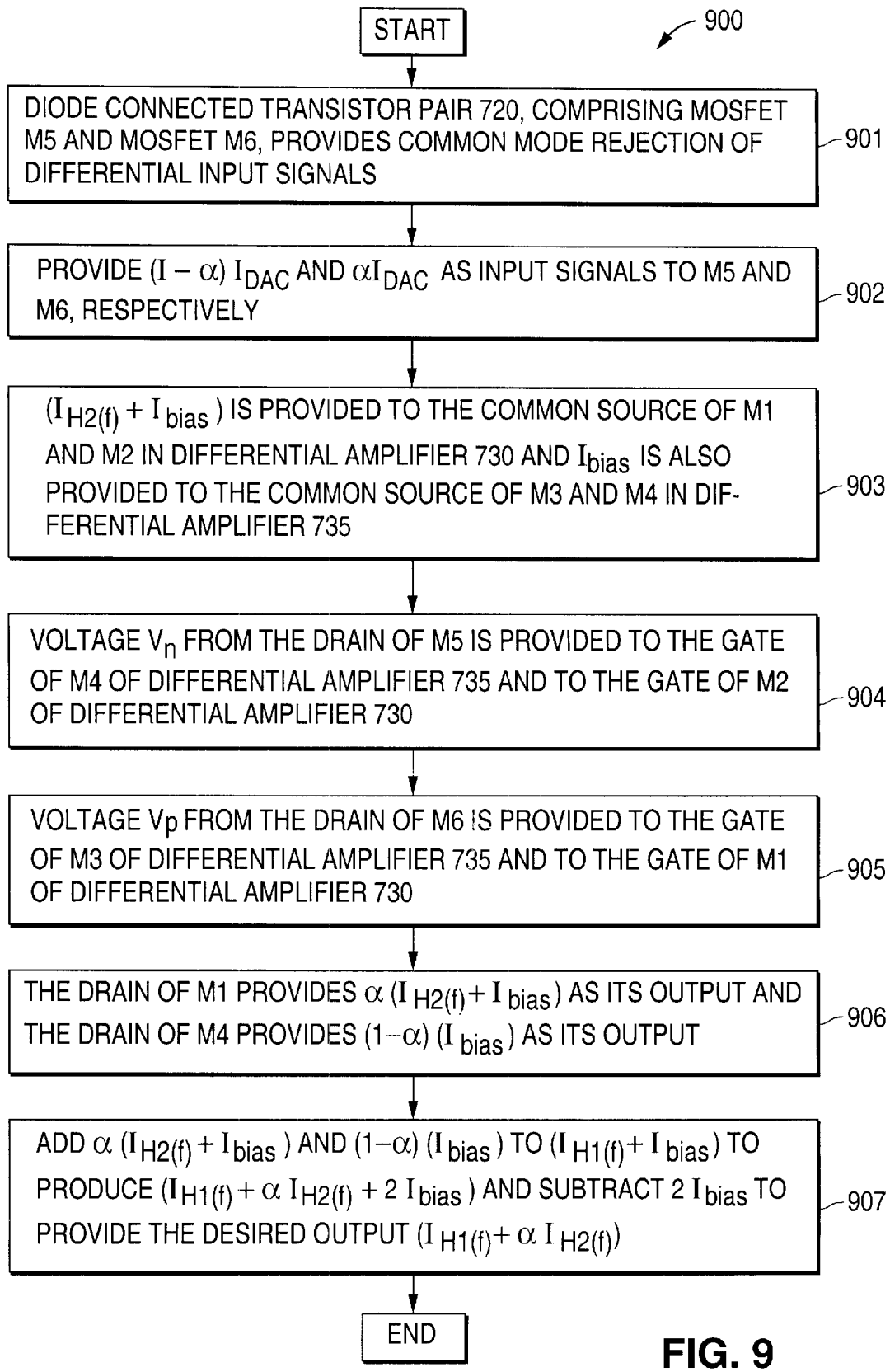
FIG. 9 is a flow diagram describing the logic of the operation of one embodiment of an exemplary differential current splitting circuit of the present invention.

FIG. 9 is a flow diagram describing the logic of the operation of one embodiment of the current splitting circuit of the present invention. In operation step 901 MOSFET transistor M5 and MOSFET transistor M6 are coupled together in the pair of diode connected transistors 720. In operation step 902 a differential current signal $(1-\alpha)\,I_{DAC}$ is provided to transistor M5 and a differential current signal $\alpha\,I_{DAC}$ is provided to transistor M6. In operation step 903 (1) a current signal $I_{H2(f)}+I_{bias}$ is provided to the common source of MOSFET transistor M1 and MOSFET transistor M2 of differential amplifier 730, and (2) a current signal $I_{bias}$ is provided to the common source of MOSFET transistor M3 and MOSFET transistor M4 differential amplifier 735.

In operation step 904 voltage signal $V_n$ from the drain of transistor M5 is provided to the gate of transistor M4 of differential amplifier 735 and to the gate of transistor M2 of differential amplifier 730. In operation step 905 voltage signal $V_p$ from the drain of transistor M6 is provided to the gate of transistor M3 of differential amplifier 735 and to the gate of transistor M1 of differential amplifier 730. In operation step 906 (1) a current signal $\alpha(I_{H2(f)}+I_{bias})$ is output from the drain of transistor M1, and (2) a current signal $(1-\alpha) I_{bias}$ is output from the drain of transistor M4.

In operation step 907 (1) current signal $\alpha(I_{H2(f)}+I_{bias})$ from transistor M1 and current signal $(1-\alpha) I_{bias}$ from transistor M4 are added to a current signal $I_{H1(f)}+I_{bias}$ to yield a current signal equal to $I_{H1(f)}+\alpha(I_{H2(f)})+2I_{bias}$ and (2) the term $2I_{bias}$ is subtracted to yield an output current signal that is equal to $I_{H1(f)}+\alpha(I_{H2(f)})$.

The output current signal represents a variable current that may vary from a minimum of $I_{H1(f)}$ (when $\alpha$ is zero) to a maximum of $I_{H1(f)}+I_{H2(f)}$ (when $\alpha$ is one). In this manner the current splitting circuit of the present invention provides current splitting for variable gain control. The present invention provides linear variable gain control using low voltages. The present invention also provides a variable gain that is independent of process-voltage-temperature (PVT) variations.

Although the present invention has been described in the context of an adaptive equalizer filter circuit, it is clear that the principle of the present invention is not limited to use in such a filter. The present invention may be used in any circuit or apparatus to provide differential current splitting.

The control current in the present invention also need not be provided by a digital to analog converter (DAC) but may also be provided by an analog control signal. The present invention may be used in either a single ended or differential configuration.

Although the present invention has been described in detail, those skilled in the art should understand that they can make various changes, substitutions and alterations herein without departing from the spirit and scope of the invention in its broadest form.

What is claimed is:

1. An adaptive equalizer circuit comprising a variable gain control circuit comprising:

a pair of diode connected transistors comprising a first transistor and a second transistor coupled together in a common mode rejection configuration, wherein said first transistor is capable of receiving an input current signal that is proportional to a first scale factor that has a value between zero and one, and wherein said second transistor is capable of receiving an input current signal that is proportional to a second scale factor that has a value that is equal to one minus said first scale factor;

a first differential amplifier comprising a third transistor and a fourth transistor, said first differential amplifier coupled to said pair of diode connected transistors and capable of receiving a first control voltage from said first transistor and capable of receiving a second control voltage from said second transistor;

a second differential amplifier coupled in parallel to said first differential amplifier, said second differential amplifier comprising a fifth transistor and a sixth transistor, said second differential amplifier coupled to said pair of diode connected transistors and capable of receiving said first control voltage from said first transistor and capable of receiving said second control voltage from said second transistor;

wherein said first differential amplifier is capable of rejecting common mode signals in an input current and providing an output current that is proportional to said first scale factor; and wherein said second differential amplifier is capable of rejecting common mode signals in an input current and providing an output current that is proportional to said second scale factor.

2. An adaptive equalizer circuit as claimed in claim 1 further comprising:

a digital to analog converter coupled to said pair of diode connected transistors, said digital to analog converter capable of generating a current signal that is proportional to a first scale factor that has a value between zero and one, and capable of generating a current signal that is proportional to a second scale factor that has a value that is equal to one minus said first scale factor.

3. An adaptive equalizer circuit as claimed in claim 2 wherein in response to a user instruction said digital to analog converter is capable of varying a value of said first scale factor to any value between zero and one.

4. An adaptive equalizer circuit as claimed in claim 1 further comprising:

a first current mirror circuit coupled to said first differential amplifier, said first current mirror circuit capable of providing an input current to said first differential amplifier to be multiplied by said first scale factor; and a second current mirror circuit coupled to said second differential amplifier, said second current mirror circuit capable of providing an input current to said second differential amplifier to be multiplied by said second scale factor.

5. An adaptive equalizer circuit as claimed in claim 1 comprising:

a first filter circuit and a second filter circuit coupled in parallel, wherein an output signal of said adaptive equalizer circuit is equal to an output signal of said first filter circuit added to a signal that comprises an output signal of said second filter circuit multiplied by said first scale factor.

6. An adaptive equalizer circuit as claimed in claim 5 wherein said first filter circuit is a transimpedance circuit with a first transfer function H1(f) that transforms an input voltage to a first output current, and wherein said second filter circuit is a transimpedance circuit with a second transfer function H2(f) that transforms said input voltage into a second output current.

7. An adaptive equalizer circuit as claimed in claimed 6 wherein an output current of said adaptive equalizer filter is equal to the sum of said first output current and a product of said first scale factor times said second output current.

8. An adaptive equalizer circuit as claimed in claim 7 wherein an output current of said first filter circuit comprises a bias current $I_{bias}$ plus an output current $I_{H1(f)}$; and wherein an output current of said first filter circuit also comprises a bias current $I_{bias}$ minus an output current $I_{H1(f)}$.

9. An adaptive equalizer circuit as claimed in claim 7 wherein an output current of said second filter circuit comprises a bias current $I_{bias}$ plus an output current $I_{H2(f)}$; and wherein an output current of said second filter circuit also comprises a bias current $I_{bias}$ minus an output current $I_{H2(f)}$.

10. An adaptive equalizer circuit comprising a variable gain control circuit comprising:

a pair of diode connected transistors comprising a first transistor M6 and a second transistor M5 coupled together in a common mode rejection configuration, wherein said first transistor M6 is capable of receiving an input current signal that is proportional to a first scale factor that has a value between zero and one, and wherein said second transistor M5 is capable of receiving an input current signal that is proportional to a second scale factor that has a value that is equal to one minus said first scale factor;

a first differential amplifier comprising a third transistor M1 and a fourth transistor M2, said first differential amplifier coupled to said pair of diode connected transistors and capable of receiving a first control voltage Vp from said first transistor M6 at a gate of said third transistor M1 and capable of receiving a second control voltage Vn from said second transistor M5 at a gate of said fourth transistor M2;

a second differential amplifier coupled in parallel to said first differential amplifier, said second differential amplifier comprising a fifth transistor M3 and a sixth transistor M4, said second differential amplifier coupled to said pair of diode connected transistors and capable of receiving said first control voltage Vp from said first transistor M6 at a gate of said fifth transistor M3 and capable of receiving said second control voltage Vn from said second transistor M5 at a gate of said sixth transistor M4;

wherein said first differential amplifier is capable of rejecting common mode signals in an input current equal to $I_{H2(f)}+I_{bias}$ from a second filter circuit of said adaptive equalizer circuit and providing an output current equal to alpha times said input current $I_{H2(f)}+I_{bias}$ where alpha is equal to said first scale factor; and wherein said second differential amplifier is capable of rejecting common mode signals in an input current equal to a bias current $I_{bias}$ used to bias said second filter circuit of said adaptive equalizer circuit and providing an output current that is equal to $(1-\alpha)$ times said bias current $I_{bias}$ where alpha is equal to said first scale factor.

11. An adaptive equalizer circuit as claimed in claim 10 further comprising an input current equal to $I_{H1(f)}+I_{bias}$ from a first filter circuit of said adaptive equalizer circuit.

12. An adaptive equalizer circuit as claimed in claim 11 capable of generating an output current signal $I_{OUT}$ equal to:

$$I_{OUT}=I_{H1(f)}+\alpha(I_{H2(f)})+2I_{bias}$$

where α (alpha) represents said first scale factor, said output current signal $I_{OUT}$ obtained by adding a current signal $I_{H1(f)}+I_{bias}$ from said first filter circuit of said adaptive equalizer circuit, and a current signal $\alpha(I_{H2(f)}+I_{bias})$ from said first differential amplifier, and a current signal equal to $(1-\alpha)(I_{bias})$ from said second differential amplifier.

13. An adaptive equalizer circuit as claimed in claim 10 wherein said first differential amplifier is capable of rejecting common mode signals in an input current equal to $-I_{H2(f)}+I_{bias}$ from a second filter circuit of said adaptive equalizer circuit and providing an output current equal to alpha times said input current $(-I_{H2(f)}+I_{bias})$ where alpha is equal to said first scale factor; and wherein said second differential amplifier is capable of rejecting common mode signals in an input current equal to a bias current $I_{bias}$ used to bias said second filter circuit of said adaptive equalizer circuit and providing an output current that is equal to $(1-\alpha)$ times said bias current $I_{bias}$ where alpha is equal to said first scale factor.

14. An adaptive equalizer circuit as set forth in claim 13 further comprising an input current equal to $-I_{H1(f)}+I_{bias}$ from a first filter circuit of said adaptive equalizer circuit.

15. An adaptive equalizer circuit as claimed in claim 14 capable of generating an output current signal $I_{OUT}$ equal to:

$$I_{OUT}=-I_{H1(f)}-\alpha(I_{H2(f)})+2I_{bias}$$

where α (alpha) represents said first scale factor, said output current signal $I_{OUT}$ obtained by adding a current signal $-I_{H1(f)}+I_{bias}$ from said first filter circuit of said adaptive equalizer circuit, and a current signal $\alpha(-I_{H2(f)}+I_{bias})$ from said first differential amplifier, and a current signal equal to $(1-\alpha)(I_{bias})$ from said second differential amplifier.

16. A method for providing variable gain control in an adaptive equalizer circuit comprising the steps of:

coupling together a pair of diode connected transistors comprising a first transistor and a second transistor in a common mode rejection configuration, wherein said first transistor is capable of receiving an input current signal that is proportional to a first scale factor that has a value between zero and one, and wherein said second transistor is capable of receiving an input current signal that is proportional to a second scale factor that has a value that is equal to one minus said first scale factor;

coupling to said pair of diode connected transistors a first differential amplifier comprising a third transistor and a fourth transistor;

providing to said first differential amplifier a first control voltage from said first transistor and a second control voltage from said second transistor;

coupling to said pair of diode connected transistors a second differential amplifier comprising a fifth transistor and a sixth transistor;

providing to said second differential amplifier said first control voltage from said first transistor and said second control voltage from said second transistor;

rejecting common mode signals in said first differential amplifier;

providing an output current from said first differential amplifier that is proportional to said first scale factor;

rejecting common mode signals in said second differential amplifier; and providing an output current from said second differential amplifier that is proportional to said first second factor.

17. The method as set forth in claim 16 further comprising the step of:

varying the value of said first scale factor to any value between zero and one in response to a user instruction.

18. The method as set forth in claim 16 further comprising the steps of:

rejecting common mode current signals in said first differential amplifier for an input current equal to $I_{H2(f)}+I_{bias}$ from a second filter circuit of said adaptive equalizer circuit;

providing an output current equal to alpha times said input current $I_{H2(f)}+I_{bias}$ where alpha is equal to said first scale factor;

rejecting common mode current signals in said second differential amplifier for an input current equal to a bias current $I_{bias}$ used to bias said second filter circuit of said adaptive equalizer circuit;

providing an output current that is equal to $(1-\alpha)$ times said bias current $I_{bias}$ where alpha is equal to said first scale factor; and providing an input current equal to $I_{H1(f)}+I_{bias}$ from a first filter circuit of said adaptive equalizer circuit.

19. The method as set forth in claim 18 further comprising the steps of:

generating in said adaptive equalizer circuit an output current signal $I_{OUT}$ equal to:

$$I_{OUT}=I_{H1(f)}+\alpha(I_{H2(f)})+2I_{bias}$$

where α (alpha) represents said first scale factor, said output current signal $I_{OUT}$ obtained by adding said current signal $I_{H1(f)}+I_{bias}$ from said first filter circuit of said adaptive equalizer circuit, and said current signal $\alpha(I_{H2(f)}+I_{bias})$ from said first differential amplifier circuit, and said current signal equal to $(1-\alpha)(I_{bias})$ from said second differential amplifier.

20. The method as set forth in claim 18 further comprising the steps of:

generating in said adaptive equalizer circuit an output current signal $I_{OUT}$ equal to:

$$I_{OUT}=-I_{H1(f)}-\alpha(I_{H2(f)})+2I_{bias}$$

where α (alpha) represents said first scale factor, said output current signal $I_{OUT}$ obtained by adding said current signal $-I_{H1(f)}+I_{bias}$ from said first filter circuit of said adaptive equalizer circuit, and said current signal $\alpha(-I_{H2(f)}+I_{bias})$ from said first differential amplifier circuit, and said current signal equal to $(1-\alpha)(I_{bias})$ from said second differential amplifier.

* * * * *

UNITED STATES PATENT AND TRADEMARK OFFICE
CERTIFICATE OF CORRECTION

PATENT NO.   : 6,486,735 B1
DATED        : November 26, 2002
INVENTOR(S)  : Abhijit M. Phanse and Michael X. Maida It is certified that error appears in the above-identified patent and that said Letters Patent is hereby corrected as shown below:

Column 10,
Line 27, delete "MS" and insert -- M5 --; and

Column 12,
Line 15, delete "MS" and insert -- M5 --.

Signed and Sealed this

Fifteenth Day of November, 2005

JON W. DUDAS
*Director of the United States Patent and Trademark Office*